(12) United States Patent
Gimzewski et al.

(10) Patent No.: US 6,243,248 B1
(45) Date of Patent: Jun. 5, 2001

(54) MOLECULAR ARRANGEMENT AND SWITCHING DEVICE

(75) Inventors: James Kazimierz Gimzewski, Ruschlikon; Rato R. Schlittler, Schoenenberg, both of (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/359,607

(22) Filed: Jul. 23, 1999

(51) Int. Cl.$^7$ ........................................ H01H 73/00
(52) U.S. Cl. .................................. 361/115; 361/58
(58) Field of Search ....................... 361/115, 58

(56) References Cited

U.S. PATENT DOCUMENTS 5,935,866 * 8/1999 Chagnon et al. .................. 436/526

\* cited by examiner

Primary Examiner—Stephen W. Jackson
(74) Attorney, Agent, or Firm—Robert M. Trepp

(57) ABSTRACT

Proposed is a molecular arrangement comprising a movable molecule which is surrounded by a molecular cage-like arrangement fixed on a surface. The movable molecule is in a mobilized state in which it is decoupled from the cage-like arrangement. This means that it is out of registry with the van-der-Waals lattice of the molecular cage-like arrangement. The movable molecule is further decoupled from the surface in that it is not physisorbed or chemisorbed thereon. It shows an energy barrier for rotational movement equal or lower than kT.

11 Claims, 3 Drawing Sheets

MOLECULAR ARRANGEMENT AND SWITCHING DEVICE

BACKGROUND OF THE INVENTION

Miniaturization of mechanical devices such as gears, bearings, and even motors has been achieved up to now through silicon micromechanics. However, these devices still have limited lifetimes and their dimensions are in the tens of microns range. Several biological systems use rotary motion, such as flagellar motors (appr. 50 nm in size) and molecular motors (appr. 10 nm in size) based on $H^+$ adenosine triphosphate synthase. Molecular-based mechanical devices have also been proposed.

OBJECT AND ADVANTAGES OF THE INVENTION

It is an object of the invention to provide a molecular arrangement that comprises a single movable molecule which is positioned within a cage-like molecular arrangement and which is movable by thermal energy. It is a further object of the invention to provide such an arrangement where the movable molecule has a mobilized state and an immobilized state. It is still a further object of the invention that the movable molecule in its immobilized state performs a rotational movement once its energy barrier to that movement is overcome. It is still another object of the invention to provide a switching device based upon said molecular arrangement.

SUMMARY OF THE INVENTION

The invention concerns the real-space realization of a single-molecule rotor surrounded by like molecules that form a supramolecular bearing. Evidence of their high-speed rotation, driven by thermal energy at room temperature, can be obtained by means of scanning tunneling microscopy (STM). The calculated energy barriers for rotation support the experimental observations.

The rotation behaviour of the single movable molecule inside the supramolecular bearing can be experimentally visualized and verified. Using a scanning tunneling microscope, the single movable molecule can be observed to exist in one of two spatially defined states laterally separated by 0.26 nanometers. One can be identified as a rotating or mobilized state and the other as an immobilized state. Calculations of the energy barrier for rotation of these two states show that it is below the thermal energy at room temperature for the rotating state, and above it for the immobilized state. The movable molecule can be moved from one state into the other with a manipulator, like an STM tip. Exerting an external influence on the statistically weighted oscillatory motion of the movable molecule will be usable to unify the rotation direction at least to some extent into one direction. This unification can be used either as a molecular motor drive or for a switch which uses the induced different probabilities of the movable molecule to be in one position and not in a second position.

DESCRIPTION OF THE DRAWINGS

Examples of the invention are depicted in the drawings and described in detail below by way of example. It is shown in FIG. 1a top view of movable molecule with a base entity and six peripheral entities.

FIG. 1b a sideview of the movable molecule of FIG. 1a.

All the figures are for sake of clarity not shown in real dimensions, nor are the relations between the dimensions shown in a realistic scale.

DETAILED DESCRIPTION OF THE INVENTION

In the following the various exemplary embodiments of the invention are described.

Figure 1A:
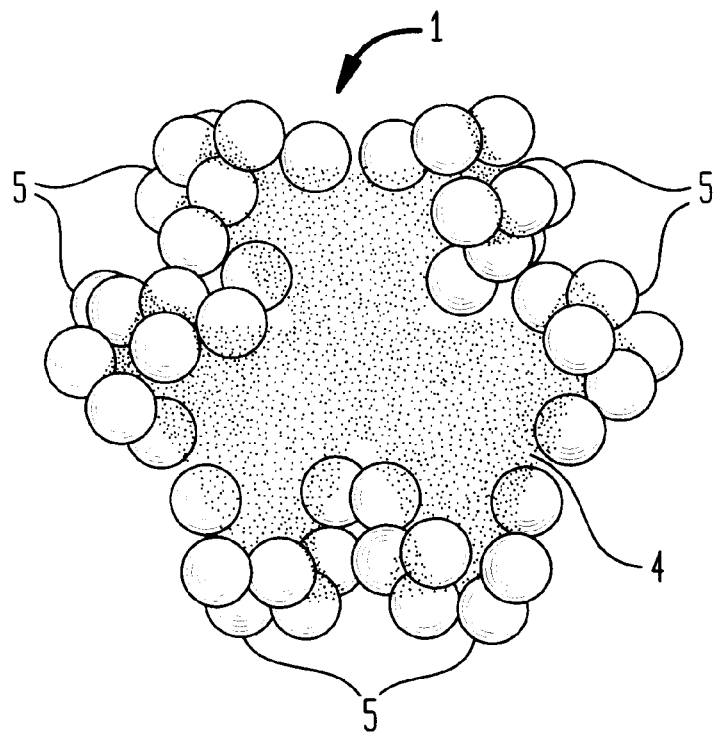
Figure 1B:
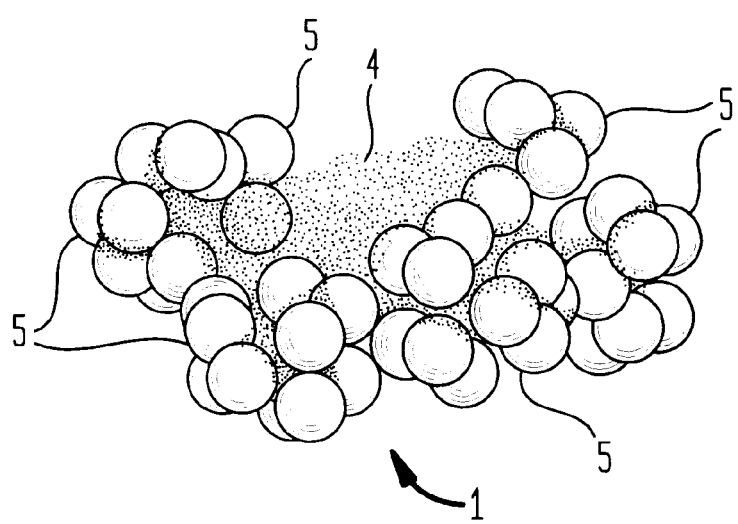

In FIG. 1a a movable molecule is depicted in a front view, in FIG. 1b in a sideview. The particular movable molecule 1 depicted is a hexa-tert-butyl decacyclene (HB-DC). This movable molecule 1 comprises as a base entity 4 a conjugated decacyclene core and as thereto attached peripheral entities 5, six bulky t-butyl legs attached to peripheral anthracene components of the movable molecule 1. The t-butyl groups are 0.757 nm apart on each naphthalene component and 0.542 nm apart attached to adjacent naphtalene components. The movable molecule 1 is rotatable and represents a propeller-shaped unit, appr. 1.5 nm in diameter. Steric interactions between hydrogen atoms on the three outer naphtalene rings twist the movable molecule 1 with respect to its central benzene ring, endowing it with a propeller form. The peripheral entities 5 serve here hence for holding the base entity 4 decoupled from the surface 3, which means also here not chemisorbed or physisorbed. The decoupling of the movable molecule 1 effects that the movable molecule 1 exhibits only a very low resistance to movement. In this case the energy barrier is lower than kT, k being the Boltzman constant, T being the absolute temperature.

Figure 2A:
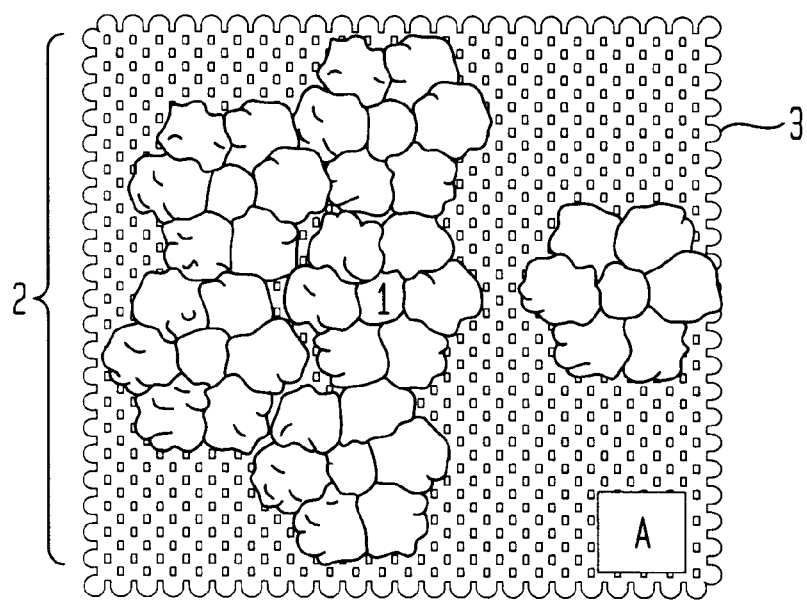
FIG. 2a a molecular arrangement with a cage-like arrangement and a movable molecule in an immobilized state FIG. 2b the arrangement of FIG. 2a with the movable molecule in the mobilized state.

In FIG. 2a the movable molecule 1 is depicted as lying on a surface 3 and within a supramolecular bearing consisting here of 4 molecules, which here are the same molecule types as the movable molecule 1, forming together a cage-like arrangement 2. The movable molecule 1 is engaged in the bearing such that it is in registry with it. This engaged state is referred to as immobilized state 7. The whole movable molecule 1, is insofar decoupled from the surface 3 as it is able to move with a relatively low energy barrier thereto. The movable molecule 1is hence neither chemisorbed nor physisorbed on the surface 3.

Figure 2B:
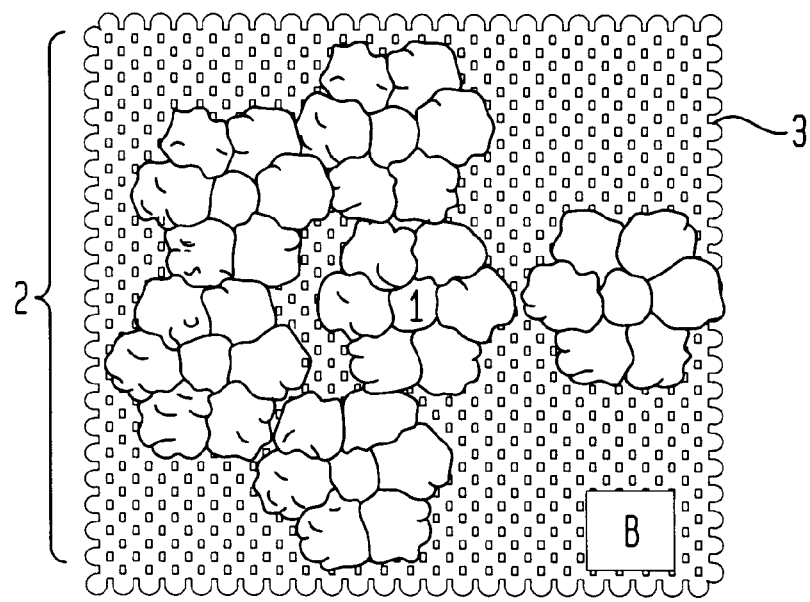

In FIG. 2b the arrangement of FIG. 2a is insofar modified as the movable molecule 1 is not in registry with the bearing. This state is referred to as the mobilized state 6. As the surface 3 an atomically clean Cu(100) surface can be used. The movable-molecule behaviour can be studied using STM in ultrahigh vacuum (UHV). At monolayer coverage, the molecules of the cage-like arrangement 2 are immobilized by intermolecular steric interactions and form a two-dimensional van-der-Waals crystal. The internal structure of each molecule thereof consists of six lobes arranged in a hexagonal lattice with alternating distances of 0.6 and 0.8 nm between the lobes. From the known dimension of the molecules and from STM-ESQC (elastic scattering quantum chemistry) calculations, each of the lobes can readily be assigned to a t-butyl appendage. For investigation purposes, the six lobes can here advantageously be used for molecular recognition and observation of molecular rotation.

HB-DC molecules adsorbed at submonolayer coverages on Cu(100) exhibits extremely high mobility as a result of the weak adsorption of the hydrogen atoms attached to the t-butyl legs on the Cu surface. Real-space imaging techniques such as STM are unable to resolve such highly diffusive molecules because they traverse the tunneling gap at speeds exceeding the response time of the electronic regulation system. At coverages of little less than one monolayer, STM images resemble those of the immobilized two-dimensional lattice at full monolayer coverage. However, there is a random array of nanoscopic voids in the molecular layer where molecules have the freedom to choose between several binding sites. In these voids the STM image shows the individual movable molecule 1 with the expected overall dimensions of the six-lobed species but displaying internal contrast in the form of a torus.

The six-lobed image can be observed if the movable molecule 1 is bound in the registry of the hexagonal overlayer of the cage-like arrangement 2. In contrast, the toroidal form is observable when the movable molecule 1 is consistently out of registry with the surrounding van-der-Waals lattice of the cage-like arrangement 2. These observations indicate that, given sufficient space at sites of low symmetry, the movable molecule 1 rotates at speeds higher than the scan rate used for imaging. This results in a time-averaged image, which reduces the six lobes to a toroidal form.

Two other possibilities exist for an explanation of the observation of toroidal structures, both of which can be discounted. It is possible that the torus is not the movable molecule 1 or is the movable molecule 1 in decomposed form, or that the molecular structure is smeared to a torus by lateral diffusion. A toroidal structure is observed when the molecular rotor is located at a low-symmetry site with respect to the surrounding molecules. After lateral translation of the same movable molecule 1 into a higher-symmetry site, the six lobes of the movable molecule 1 in the immobilized state 7 can be clearly observed. This observation supports the conclusion that an intact form of the movable molecule 1 exists in the rotational, i.e. mobilized state 6 and in the immobilized state 7. If the movable molecule 1 were to exhibit a very rapid translational oscillatory motion, then the dimensions of the toroidal structure would be larger than those of the molecular image in its immobilized state 7. Since the overall dimensions of the torus and the six-lobed structures are identical, this possibility can be eliminated.

The above observations permit to make some statements concerning the nature of the molecular rotor. First, rotation occurs at low-symmetry sites and is controlled by supramolecular interactions of the molecular rotor with a bearing formed by the surrounding molecules, i.e the cage-like arrangement 2. Second, the rotation appears to be driven by thermal energy.

Using ESCQ coupled with molecular mechanics calculations (ESQC-MM2), the mechanics of the molecular cage-like arrangement 2 have been computed. In the immobilized state 7, a rotational barrier of 117 kJ/mol is present. Here the central HB-DC movable molecule 1 forms a ratchet in the cavity and hence has no significant rotational degree of freedom at room temperature. In the mobilized state 6, the movable molecule 1 is first shifted 0.26 nm out of registry with the molecular lattice of the cage-like arrangement 2. This is sufficient to lower its rotation barrier to 29 kJ/mol, and the movable molecule 1 is then free to rotate. This is in agreement with the experimental observations. As the movable molecule 1 is rotated, the conformation of the t-butyl groups in contact can be observed to reorient. In addition, a translation-energy barrier to move the movable molecule 1 from the immobilized state 7 to the disengaged mobilized state 6 of ~42 kJ/mol was calculated. This is consistent with the observation of a low rate of lateral shuttle action driven by the thermal energy kT when the movable molecule 1 moves from the immobilized state 7 to the mobilized state 6.

Compared to many proposed or synthesized molecular mechanisms, the herein described molecular rotor works in a dry state, and appears to be wearless. The transition from the immobilized state 7 to the mobilized state 6 can be controlled locally by an actuator means like using STM tip manipulation. The mass of the rotor is only $1.3 \times 10^{-24}$ kg, leading to negligible inertia, and the rotating movable molecule 1 will stop instantaneously when the external source for the rotation, i.e. drive is stopped. A recording of the tunnel current and its Fourier components up to appr. 30 kHz for the immobilized state 7 and the mobilized state 6 shows that the tunnel-current noise displays a 1/f noise characteristic similar to the immobilized movable molecule 1, indicating that the motion occurs on a shorter time scale.

The potential energy profile is highly asymmetric but periodic in the immobilized state 7. Chemically driven protein motors and unimolecular ratchets also have asymmetric rotational potentials. These potentials are reminiscent of Feynman's "ratchet and pawl" devised to show that it is not possible to extract unidirectional rotational work from background thermal noise. Similar to Maxwell's demon, the second law of thermodynamics cannot be violated by such macroscopic devices because one cannot extract work from background white noise. It nevertheless is possible that work can be extracted using an asymmetric periodic potential if a secondary colored noise is applied and therefore rectified by the system. Devices with nanoscale dimensions may actually approach the limit of the second law of thermodynamics, be they mechanically or electrically driven.

Such a mechanical "ratchet and pawl" device, can be created with a strong enough asymmetric periodic profile at room temperature to ensure the necessary conditions for a completely unidirectional rotation of the molecular rotor. In that sense a direction-unifying means is used for making the arrangement a motor with at least a statistically weighted uniform rotation direction. The molecular rotor or the cavity can be reengineered to optimize the supramolecular ratchet-bushing interaction. In this case, to drive the rotor unidirectionally by thermal means, an additional input is usable to increase the molecular-rotor potential-energy over the ratchet potential barrier at pseudorandom time intervals. The ratchet potential barrier should have a potential energy barrier bigger than kT in order not to suffer from Brownian behaviour too. For example, a tunnel current input on the bearing will inelastically heat the molecular rotor, thus providing a method to rectify thermal noise.

Figure 3:
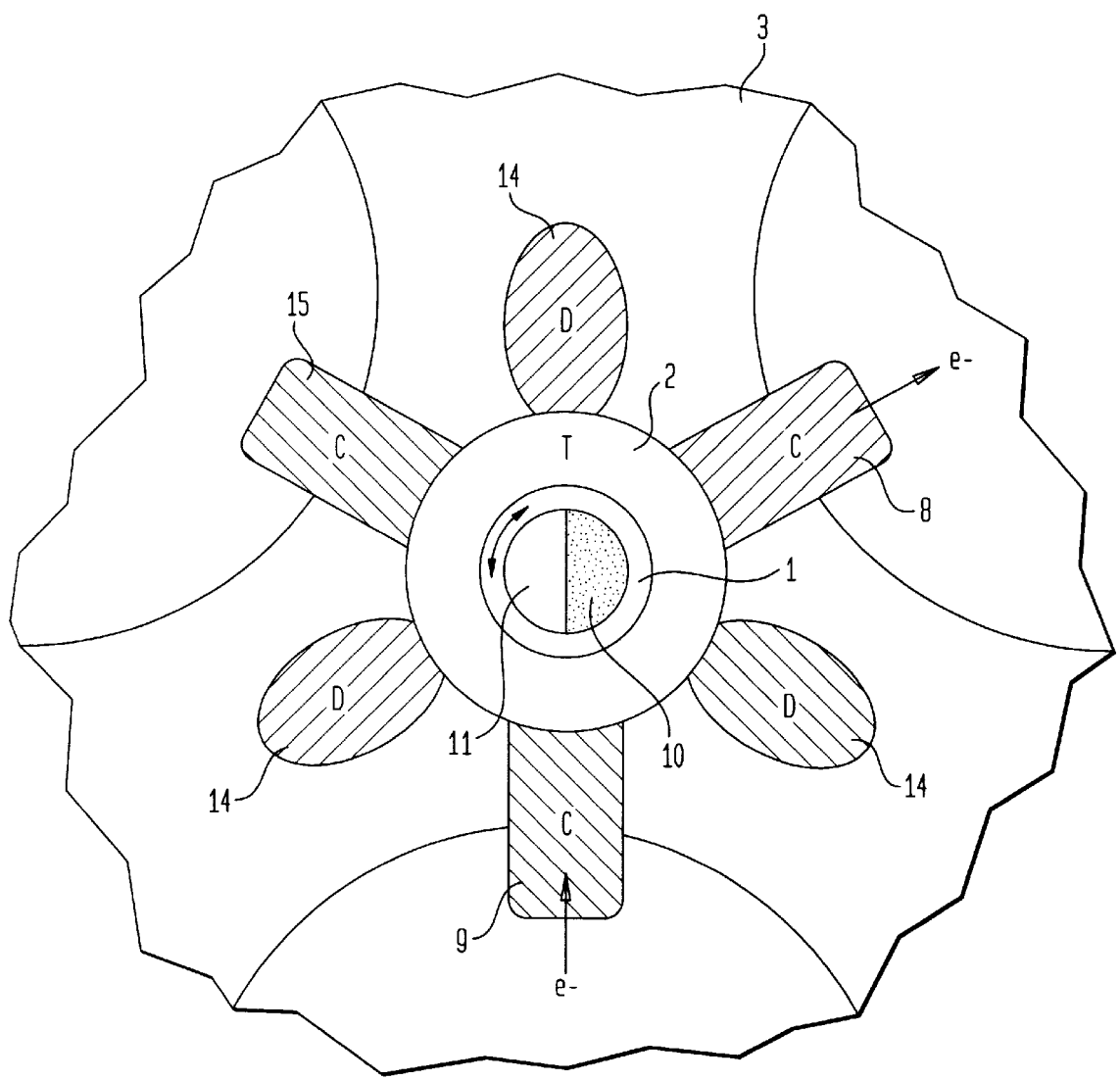
FIG. 3 a three-terminal device with a movable molecule as switching element.

In FIG. 3 a three-terminal device is depicted, having a first terminal 8, a second terminal 9 and a third terminal 15, all connected to the already described molecular arrangement in a way, that the movable molecule 1, which is designed to have an electrically conductive portion 10 and an electrically non-conductive portion 11, is able to provide an electrical connection between the first terminal 8 and the second terminal 9. This connection is provided, when the movable molecule 1 is in a first position 12. When the movable molecule 1 is in a second position 13, which here is a position when the movable molecule 1 has rotated 180° around its center, this conductive connection is interrupted and instead, a connection between the second terminal 9 and the third terminal 15 is the result. The molecular cage-like arrangement 2 has attached to it three decoupling molecules 14 such as t-butyl or a-tert-butyl phenyl molecules. These decoupling molecules 14 are however not mandatory. The terminals 8, 9 may be themselves of a molecular nature in order to be best couplable to the molecular arrangement. Naphtalene molecules are suitable therefor.

Hence, the arrangement can serve as a switching means, the movable molecule 1 being the switching element therein. When the movable molecule 1 has a potential energy barier that is lower than kT, the movable molecule 1 rotates due to brownian motion in a randomly distributed oscillatory mode. This means that time-averaged current flow between the second terminal 9 and the first terminal 8 resp. the third terminal 15 is equal respectively statistically weighted. An application of an external voltage for example can cause the movable molecule 1 to change the statistical distribution such that the time-averaged current flow to either the first terminal 8 or the third terminal 15 is higher. The switching device can as well operate on polarisation, electron or conformational changes. The device by virtue of size and molecular nature approaches the kTln2 limit, i.e. the absolute energy efficiency of a switch. A unit density of $10^{13}/cm^2$ is feasible with this device.

If the potential energy barrier is bigger than kT, then the device can act as a memory element. Possible applications of this device lie in use as a molecular transistor which can render PCs consuming much lower power than known up to date.

For the arrangement to work, it is not necessary for the movable molecule 1 to have the peripheral entities 5, as long as the movable molecule 1 is decoupled in the above mentioned meaning from the surface 3. The molecules of the cage-like arrangement need not be of the same type as the movable molecule 1 but they can be essentially of the same type which facilitates holding the movable molecule 1 in the immobilized state 7. For the switching device, it is also possible to have the movable molecule 1 exhibit any other asymmetric nature which can be exploited in the two or even some more positions of the movable molecule 1 in order to perform a switching behaviour. Inhomogeneous chemical properties as well as physical properties are suited, like polarisation, heat conductivity, light absorbance etc. The statistical weight of the probability of the movable molecule 1 to be in one certain of its positions 8, 9, can be influenced by any external control means in order to create a probability difference that makes the molecule position less equally distributed and hence to at least some extent determinable and hence explotable. Such influence can be illumination with light, irradiation of any kind, thermal or other physical influence as well as chemical influence or any combination thereof.

What is claimed is:

1. Molecular arrangement comprising a movable molecule (1) which is surrounded by a molecular cage-like arrangement (2) fixed on a surface (3), whereby said movable molecule (1) is in a mobilized state (6) which is characterized in that said movable molecule (1) is decoupled from said cage-like arrangement (2) in that it is out of registry with the van-der-Waals lattice of said molecular cage-like arrangement (2) and said movable molecule (1) is further decoupled from said surface (3) in that it is not physisorbed or chemisorbed thereon and that said movable molecule (1) shows an energy barrier for rotational movement equal or lower than kT, k being the Boltzmann constant, T being the absolute ambient temperature.

2. Molecular arrangement according to claim 1, whereby the movable molecule (1) comprises a base entity (4), preferably comprising a decacyclene core, and peripheral entities (5) that are decoupled from the surface (3) in that they are not physisorbed or chemisorbed thereon, and that hold said base entity (4) in a position decoupled in the same way from said surface (3), said peripheral entities (5) preferably being bent or twisted through steric interactions between atoms thereof.

3. Molecular arrangement according to claim 1, whereby the molecular cage-like arrangement (2) comprises cage molecules of essentially the same type as the movable molecule (1).

4. Molecular arrangement according to claim 1, comprising actuator means, preferably comprising an STM tip, for bringing the movable molecule (1) from an immobilized state (7), wherein said movable molecule (1) is in registry with the surrounding van-der-Waals lattice, into the mobilized state (6) and/or vice versa.

5. Molecular arrangement according to claim 1, being subjectable to an asymmetric periodic potential, preferably a secondary colored noise and/or comprising for the rotational movement direction-unifying means having a potential barrier greater than kT and whereby the potential energy of the movable molecule (1) is increasable over said potential barrier, at least at pseudorandom time intervals.

6. Switching device with at least two terminals (8, 9), preferably naphtalene molecules, comprising a movable molecule (1) according to one of claims 1 to 5, which is designed to have an electrically conductive portion (10) and an electrically non-conductive portion (11), said terminals (8, 9) being arranged such that in a first position (12) of said movable molecule (1) said terminals (8, 9) are electrically connected and in a second position (13) of said movable molecule (1) said terminals (8, 9) are electrically disconnected, said two positions (12, 13) differing in a rotation angle of said movable molecule (1).

7. Switching device according to claim 6, wherein the molecular cage-like arrangement (2) around the movable molecule (1) is decoupled from the surface (3) by at least one decoupling molecule (14), preferably a t-butyl or a-tert-butyl phenyl molecule.

8. Switching device according to claim 6, wherein the probability of the movable molecule (1) being in one of the two positions (12, 13) is on the average at 50%.

9. Switching device according to claim 6, wherein the movable molecule (1) is switchable between the two positions (12, 13) by application of an external electrical voltage, preferably in that the statistical balance of the probabilities of the two positions (12, 13) is disturbable by application of an external electrical voltage, and/or the movable molecule (1) is switchable between the two positions (12, 13) by an external influence on its polarization, electron structure or conformation.

10. Switching device according to claim 6, having a 3rd terminal (15) electrically connected to the first terminal (8) in the second position (13) and electrically disconnected to said first terminal (8) in the first position (12).

11. Switching device with at least two terminals (8, 9), preferably naphtalene molecules, comprising a movable molecule (1) according to one of claims 1 to 5, but with an energy barrier for rotational movement bigger than kT, which movable molecule (1) is designed to have an electrically conductive portion (10) and an electrically non-conductive portion (11), said terminals (8, 9) being arranged such that in a first position (12) of said movable molecule (1) said terminals (8, 9) are electrically connected and in a second position (13) of said movable molecule (1) said terminals (8, 9) are electrically disconnected, said two positions (12, 13) differing in a rotation angle of said movable molecule (1).

* * * * *